(12) United States Patent
Ansell

(10) Patent No.: US 8,709,268 B2
(45) Date of Patent: Apr. 29, 2014

(54) ETCHING APPARATUS AND METHODS

(71) Applicant: SPTS Technologies Limited, Newport (GB)

(72) Inventor: Oliver James Ansell, Berkeley (GB)

(73) Assignee: SPTS Technologies Limited, Newport (GB)

( * ) Notice: Subject to any disclaimer, the term of this patent is extended or adjusted under 35 U.S.C. 154(b) by 0 days.

(21) Appl. No.: 13/674,482

(22) Filed: Nov. 12, 2012

(65) Prior Publication Data

US 2013/0137195 A1  May 30, 2013

Related U.S. Application Data

(60) Provisional application No. 61/559,252, filed on Nov. 14, 2011.

(51) Int. Cl.
*G01L 21/30* (2006.01)
*G01R 31/00* (2006.01)

(52) U.S. Cl.
USPC .......................................... 216/60

(58) Field of Classification Search
CPC ............... H01L 22/26; H01J 37/32972
USPC ................................. 216/60, 85, 88
See application file for complete search history.

(56) References Cited

U.S. PATENT DOCUMENTS 6,509,960 B2 * 1/2003 Johnson et al. ............... 356/72
2005/0020073 A1 1/2005 Perry

FOREIGN PATENT DOCUMENTS

EP           0653621 A1    11/1994
WO     WO99/23472 A1     5/1999

* cited by examiner

*Primary Examiner* — Roberts Culbert
(74) *Attorney, Agent, or Firm* — Volentine & Whitt, PLLC

(57) ABSTRACT

A method of etching the whole width of a substrate to expose buried features is disclosed. The method includes etching a face of a substrate across its width to achieve substantially uniform removal of material; illuminating the etched face during the etch process; applying edge detection techniques to light reflected or scattered from the face to detect the appearances of buried features; and modifying the etch in response to the detection of the buried feature. An etching apparatus for etching substrate across its width to expose buried is also disclosed.

15 Claims, 10 Drawing Sheets

Graph showing the metric of average intensity within a region of interest during a process. This data was taken from a region of interest of approx 3cm x 2cm in the centre of a 200mm diameter wafer. Representative images are shown below.

Example of camera and illuminating positioning

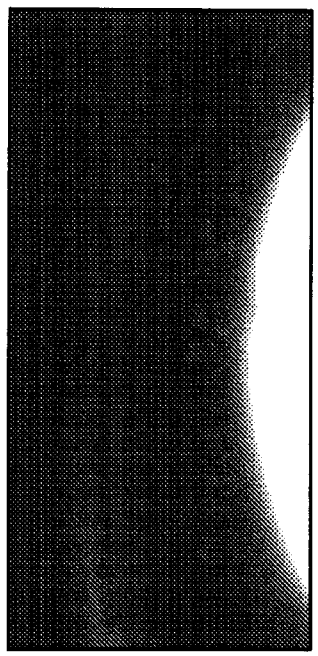 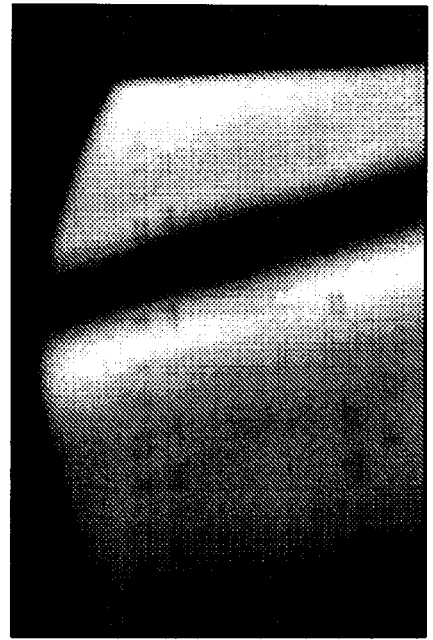
Fig. 5(a)　　　　　Fig. 5(b)
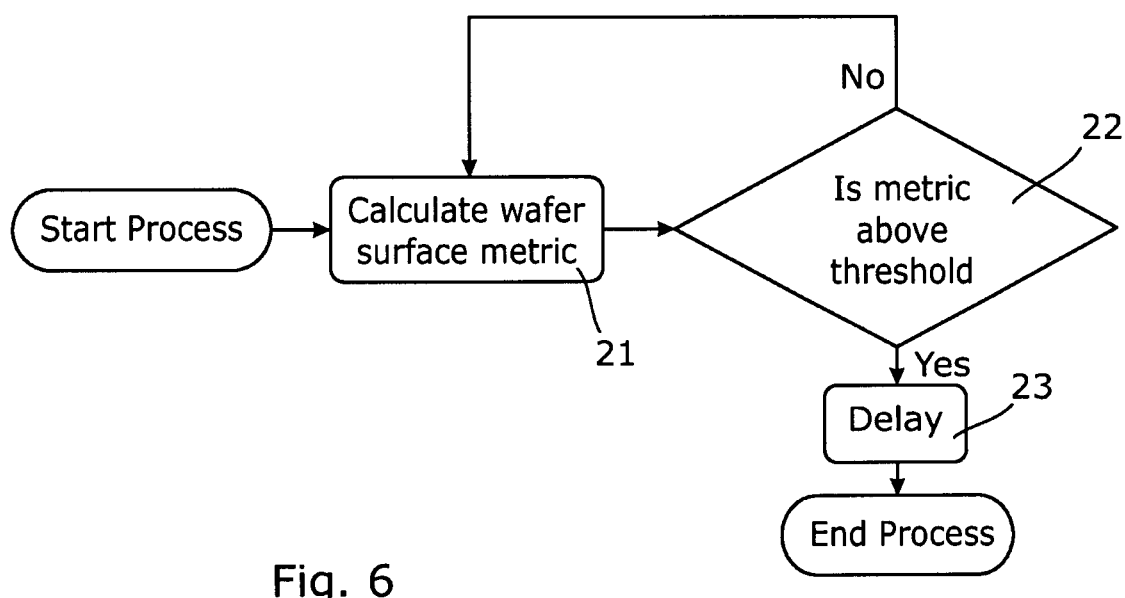
Fig. 6

Graph showing the metric of average intensity within a region of interest during a process. This data was taken from a region of interest of approx 3cm x 2cm in the centre of a 200mm diameter wafer. Representative images are shown below.

Processed image before endpoint

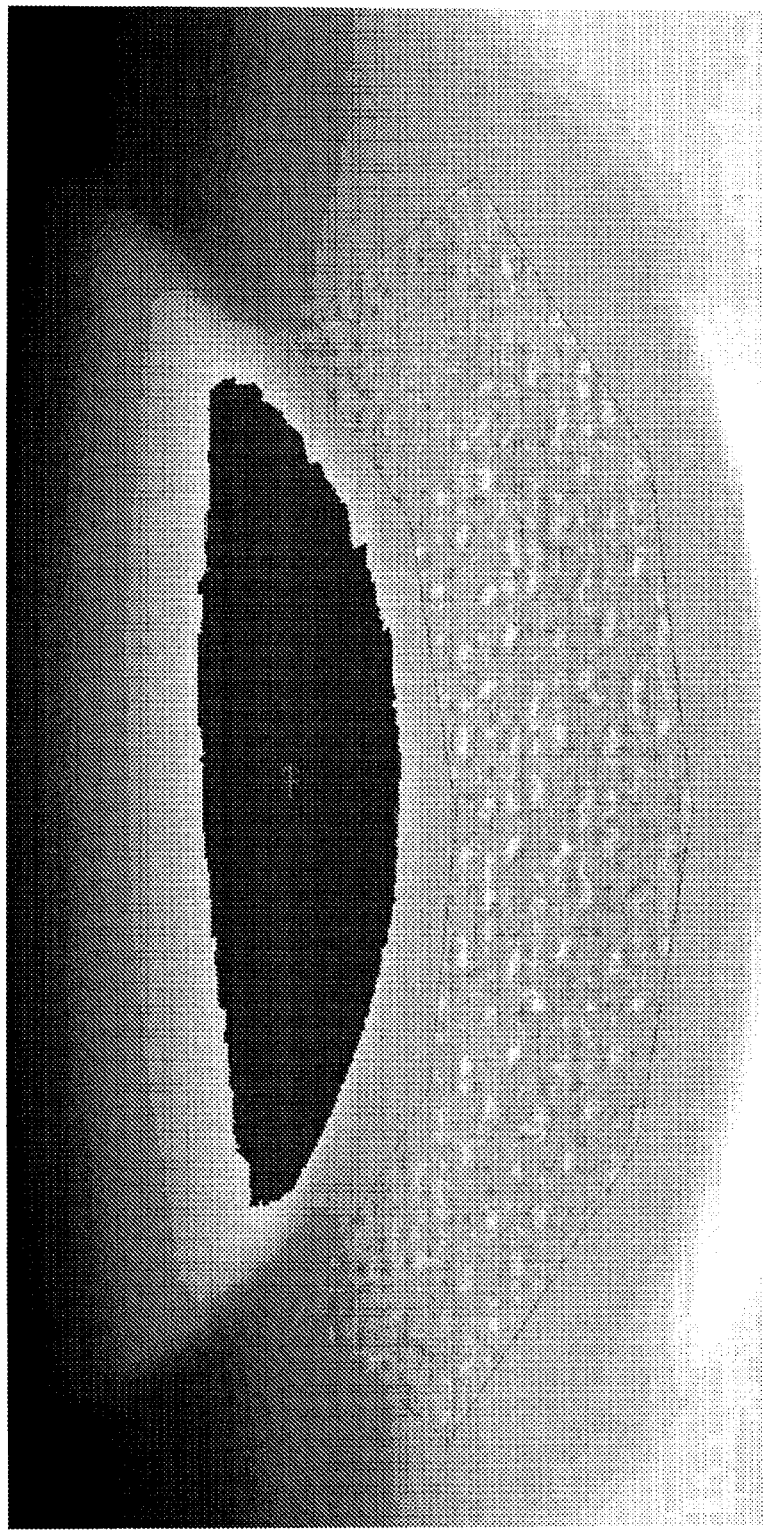
Fig. 8(b) Processed image after endpoint

Raw image after endpoint

ETCHING APPARATUS AND METHODS

BACKGROUND

This invention relates to apparatus and methods for uniformly removing material across the whole width of a substrate by plasma etching to expose the ends of buried, filled vias or other buried features.

The problem of end point detection is well known in the plasma etch industry and various techniques have been developed to detect the point at which a substrate has been etched to the desired depth, so that the etch process can be halted. In typical applications, features are etched through a mask layer into the underlying layer or layers. The detection of the end point (the reaching of the desired etch depth) tends to be based on two distinct technologies. In one, the apparatus or operator is looking for a change in chemistry at the point at which the etch breaks through from one layer to another. This may arise from a change in the chemistry of the actual layers built up in the device or thin etch stop layer may be deliberately deposited between two layers so as to induce a change in chemistry. In early days the etch was simply carried on for a fixed time. More sophisticated and faster techniques have been developed over the years. The second technique is based on reflectometry or interferometry which rely on the upper surface of the substrate (e.g. the hard mask) forming a reference surface against which the depth of the etched structure may be judged.

Recently, 3-D device integration schemes have started to produce new challenges for process equipment. A possible process and equipment flow is shown in FIG. 1, which is Figure EP17 from the assembly and packaging section of the 2009 edition of the ITRS (International Technology Roadmap for Semiconductors). This illustrates the progressive development of the device and, in the highlighted part of the sequence, calls for sequential thinning. In this step a device in which filled vias had been formed is inverted so that the backside of the substrate can be removed down to the level of the tops of the filled vias or other buried feature.

Traditionally, this might all have been done by chemical mechanical polishing but there are advantages in performing the later stages of the step using a plasma etch process. US-B2-7416648 is an example of such a process. However, because the substrate is etched across its width, there is no reference surface by means of which reflectometry or interferometry could be used. Equally, the buried features are so small (typically 10 μm diameter), and form such a small part of the total area of the etch face, that any change in chemistry is too small to detect. The whole top surface etching process is schematically illustrated in FIG. 2. If the thickness of material above the buried features is significant, then it may be convenient to use chemical mechanical polishing until quite close to the expected positions of the tips of the buried features, e.g. within 10 μm and then to etch. FIG. 1(a) is illustrative of a pre-etch situation.

SUMMARY

From one aspect the invention consists in a method of etching the whole width of a substrate, typically in the absence of a masking layer, to expose the ends of buried features, e.g. filled vias, including:
(a) etching the face of a substrate across its width to achieve substantially uniform removal of material;
(b) illuminating the etched face during the etch process;
(c) detecting non-homogeneity in an image of the face represented by light reflected or scattered from the face to detect the exposure of the buried features; and
(d) modifying the etch in response to the detecting of the buried features.

From a second aspect, the invention consists in a method of etching the whole width of a substrate to expose buried features, (e.g. filled vias) including:
(a) etching the face of a substrate across its width to achieve substantially uniform removal of material;
(b) illuminating the etched face during the etch process;
(c) applying edge detection techniques to light reflected or scattered from the face to detect the appearance of the buried features; and
(d) modifying the etch in response to the detection of the buried features.

It will be understood that in each of these processes the problems of the lack of reference surface and the lack of significant plasma chemistry change have been overcome.

The step of modifying the etch includes changing the process conditions or stopping the etch.

It is particularly preferred that the etch face is illuminated at an acute angle and in either case step (c) may include using a camera to capture the reflected or scattered light for producing an output signal and an edge detector filter for detecting the appearance of edges from the camera output signal.

The camera may be positioned for receiving light reflected or scattered at an acute angle.

The edge detector filter may be a Sobel filter.

From a further aspect the invention consists in etching apparatus for etching a substrate across its width to expose buried features, (e.g. filled vias) including:
(a) an etch chamber for etching a substrate;
(b) a support for a substrate for retaining the substrate in a generally horizontal position with a face to be etched exposed;
(c) an illumination source mounted at an acute angle with respect to the support for illuminating the face;
(d) a camera for capturing light reflected or scattered from the face at an acute angle;
(e) an edge detector coupled to the camera for detecting the appearance of at least one edge on the face; and
(f) a controller for controlling the etch operation of the chamber and stopping the etch in response to the detection of an edge.

The edge detector may utilise a Sobel filter.

It will be understood that the edge detector could be replaced by any suitable non-homogeneity detector for detecting non-homogeneity in the appearance of the face. However due to the orthogonal arrangement used in the layout of vias on a wafer the use of a Sobel filter or filters is particularly useful for edge detection.

Although the invention has been defined above it is to be understood it includes any inventive combination of the features set out above or in the following description.

BRIEF DESCRIPTION OF THE DRAWINGS

The invention may be performed in various ways and is a specific embodiment will now be described, by way of example, with reference to the accompanying drawings, in which:

FIGS. 5(a) and 5(b) show processed images from reflected light and scattered light respectively;

FIG. 6 is a schematic flow diagram of an embodiment of the Applicants' process;

FIGS. 8(a), 8(b) and 8(c) are respectively a processed image before the end point, a processed image after the end point and a raw image after the end point.

DETAILED DESCRIPTION OF EMBODIMENTS

Figure 4A:
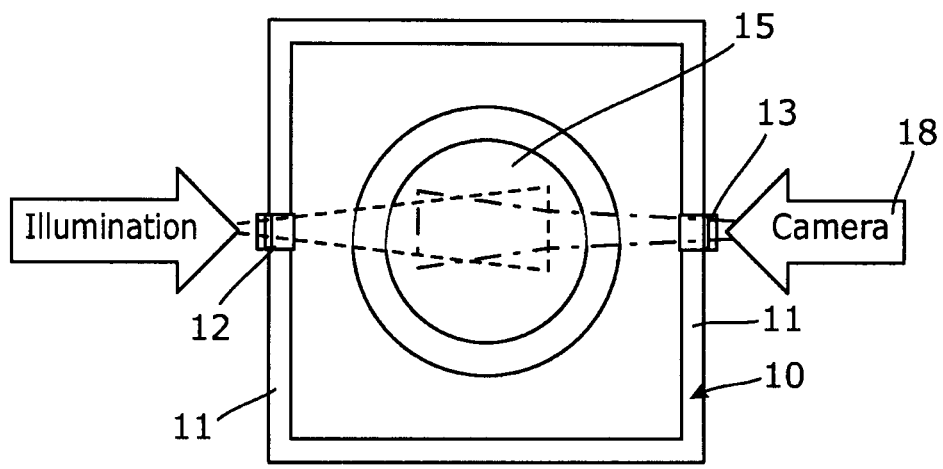
FIGS. 4(a) and 4(b) are schematic plan and side views of an apparatus illustrating possible illumination and camera positions.
Figure 4B:
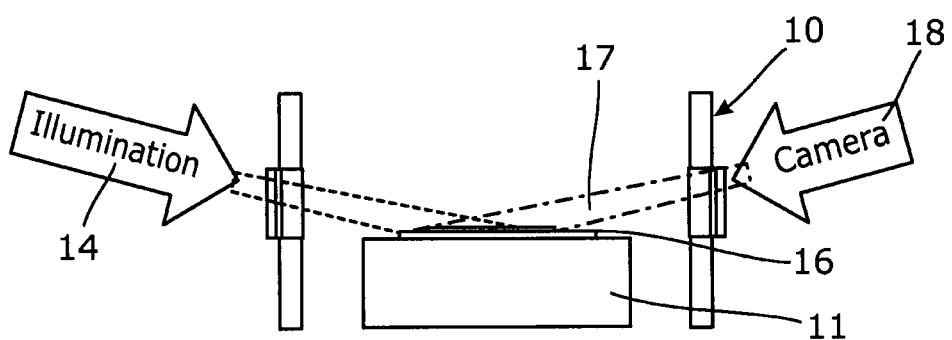

FIGS. 4 (a) and (b) show, schematically, a part of an etch chamber 10, which encloses a substrate support 11. The construction and operation of such chambers is well known to persons skilled in the art and will not be described here other than is necessary for an understanding of the invention.

Windows 12, 13 are formed in respective opposed walls 11 of the chamber 10. An illumination source 14 illuminates a part of the surface of an exposed face 15 of the substrate 16. Scattered radiation 17 passes to a camera 18 through the window 13 and is detected by the camera 18.

Figure 1:
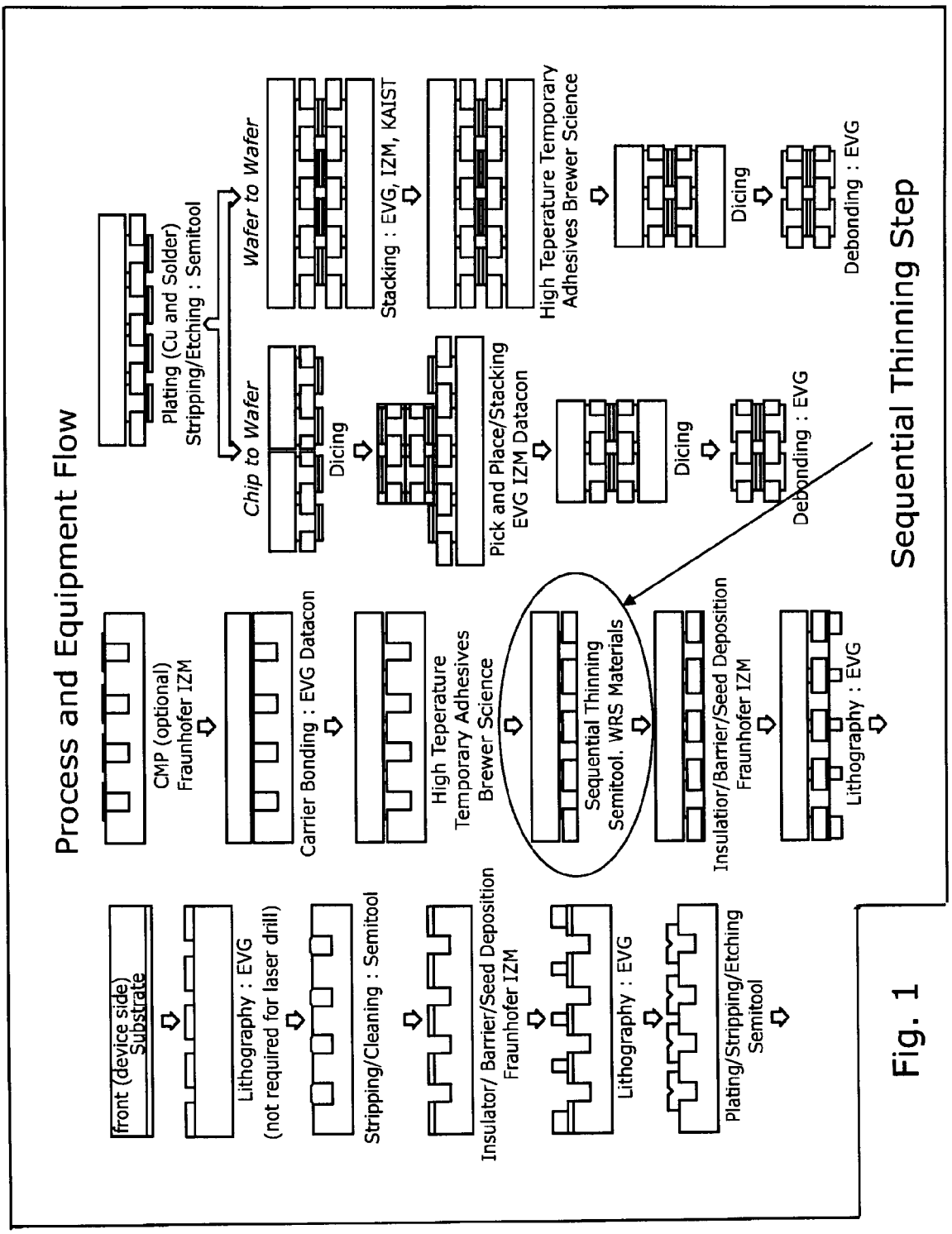
FIG. 1 is a process and equipment flow as described above.
Figure 2B:
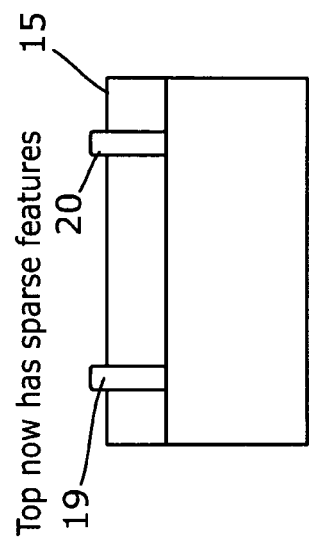
FIGS. 2a and 2b are schematic diagrams showing the etch process to be performed.
Figure 2A:
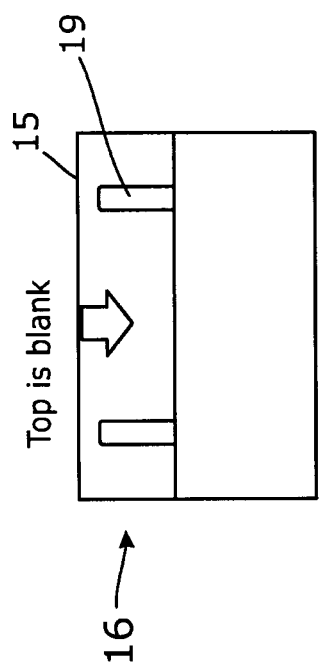

There are a large number of image detection techniques which could be used to distinguish successive images detected by the camera to determine the change of the face 15 from a homogeneous face to non-homogeneous face, as a result of the appearance of the upper surfaces of buried features. For simplicity these features will be treated as being filled vias for the rest of this description. These are for example illustrated at 19 in FIGS. 2(a) and (b). However, in a number of such detection techniques the pixel size of the camera would need to be less than the surface area of the exposed buried feature. As the buried features are typically 10 μm in diameter this is technologically demanding and requires an extremely expensive camera. Accordingly, in particular embodiments the Applicants have appreciated that they can avoid the need for this pixel size limitation by using edge detection techniques, such as a Sobel filter.

Figure 3A:
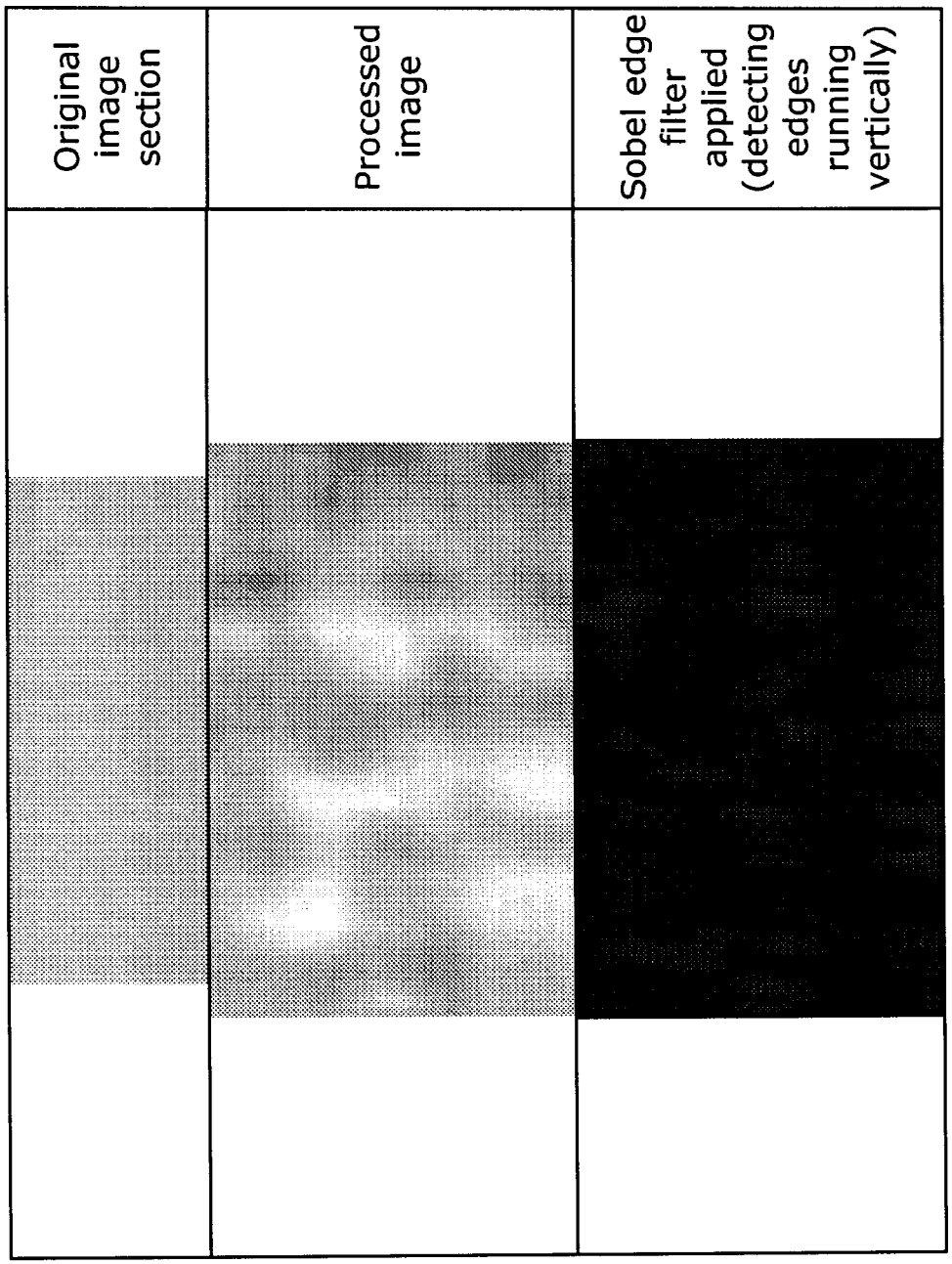
FIG. 3(a) shows an original image from a camera of the Applicants' apparatus showing a surface in which buried features have been exposed, the surface image after etching, and the image after Sobel edge filter has been applied.
Figure 3B:
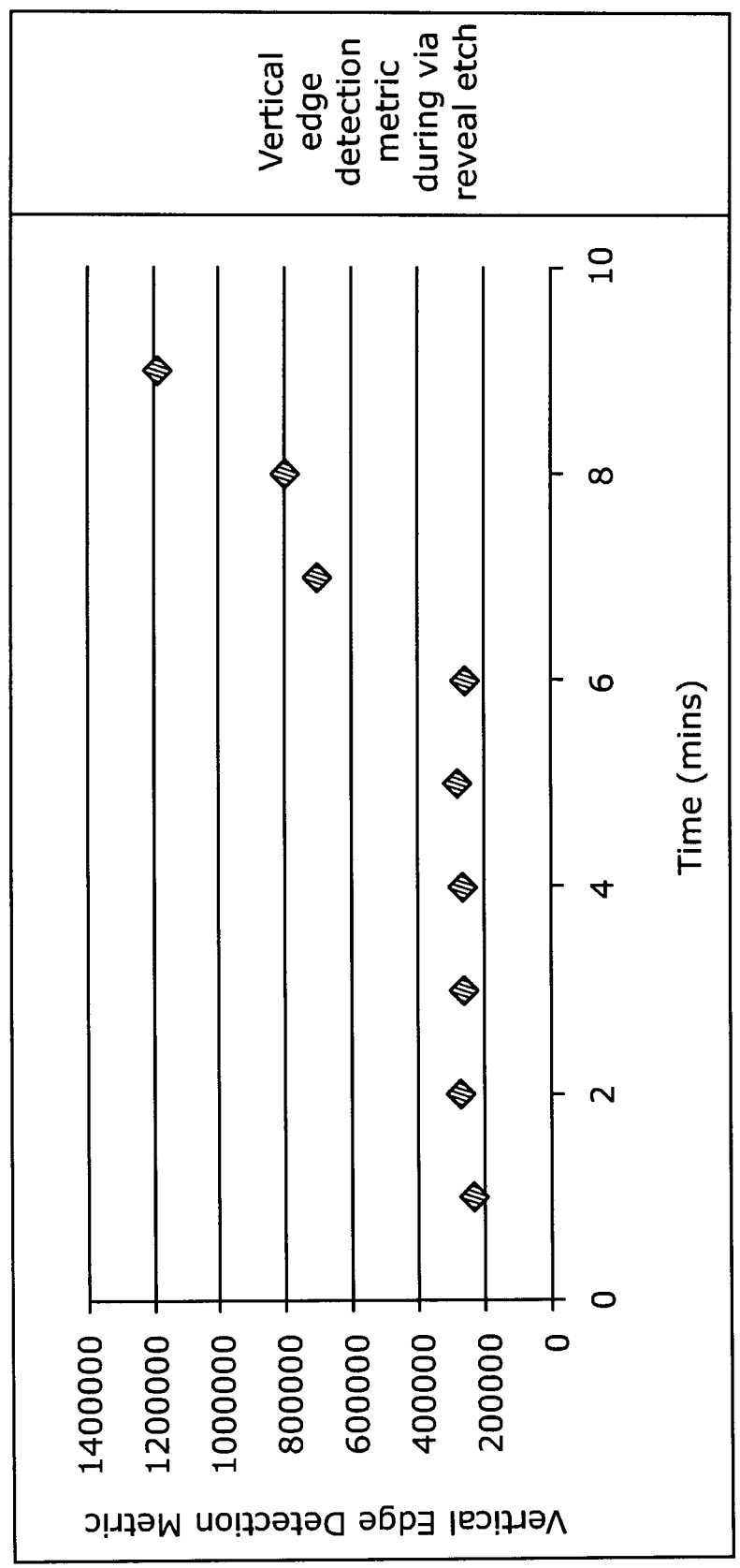
FIG. 3(b) shows the change in intensity signal of the vertical edge detection as a function of etch time.

The advantages of this can be seen in FIGS. 3(a) and 3(b). FIG. 3(a) shows the basic image of the illuminated section of the face 15, an image of an etched feature which has been enlarged and contrast enhanced, and the image after it has been processed by a Sobel edge filter. It will be apparent that the detected vias are now significantly more visible and the resultant change in intensity in the Sobel filter is enhanced because the buried features are aligned.

Sobel filters are well known in the art but for ease of understanding of the present invention they utilise a Sobel operator which is a discrete differentiation operator, computing an approximation of the gradient of the image intensity function. In practice they apply to sequence a vertical and horizontal filter to an image. The intensities of the images are then processed to enhance the appearance of the edges of the features in the image. Preferably this sequence is carried out throughout the etch process. This is illustrated for the region of the wafer for which the images in FIG. 3(a) are taken by the graph shown in FIG. 3(b). The section for the first six minutes of etch shows no significant change in intensity of the vertical edge detection signal because the surface is homogeneous and then after six minutes the graph rises due to the appearance of buried features creating changes in the intensity gradient in the image. This change in gradient can be used as an etch end-point signal.

FIGS. 5(a) and (b) illustrate processed images where the light is scattered (i.e. the light source is opposite the camera) or reflected (i.e. the light source is transmitted from the same side as the camera). When the light is reflected, the features show brighter than the background as in FIG. 5(a), whereas when it is scattered they are darker than the background as in FIG. 5(b).

Positioning the camera at a shallow angle to the wafer means that the topography of the wafer is enhanced in the image relative to viewing directly from above. In a simplistic way one might see the slightly exposed tips 20 of the filled vias 19 as casting individual shadows. The more inclined the illumination, the greater the length of the shadow and the increased changed in the intensity gradient.

FIG. 6 illustrates schematically the process. Thus the process is started and the camera is monitored as a function of time. The light incident on the camera passes through the Sobel filter 21 to produce an enhanced image. The output signal of the Sobel filter 24 is fed to a comparator 22. If the filter output is above a preset threshold then the comparator feeds a signal to a delay 23, which then either stops or modifies the process.

Components 22 and 23 will usually form part of the controller for the etch apparatus.

Figure 7:
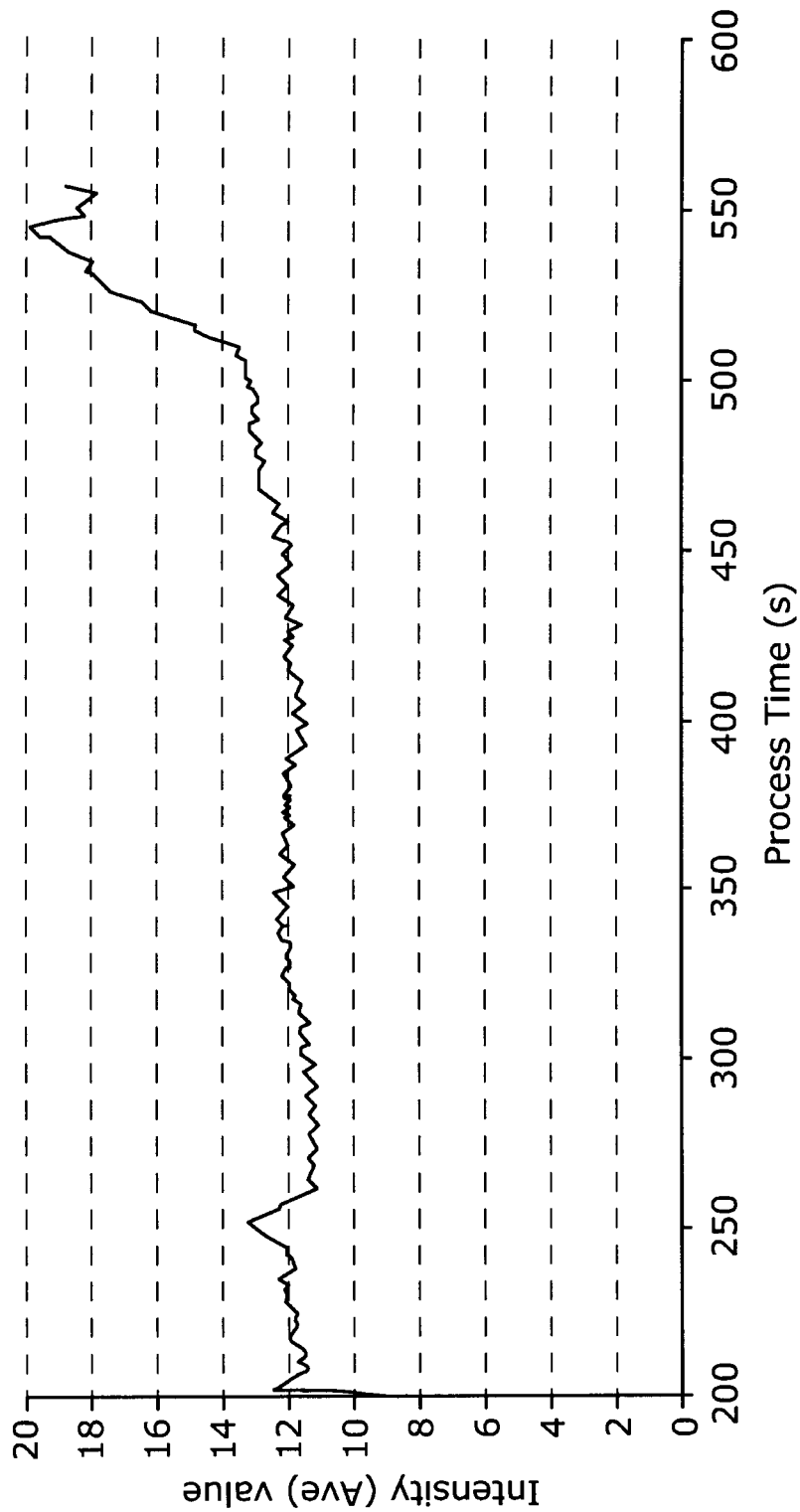
FIG. 7 shows the average intensity in the region of interest on the face during the process for the output of the Sobel filter.

This method is further illustrated in FIG. 7, which shows the average intensity of the camera output within a region of interest during the process. This sharp rise in average intensity after around 500 seconds illustrates the appearance of exposed vias.

Figure 8A:
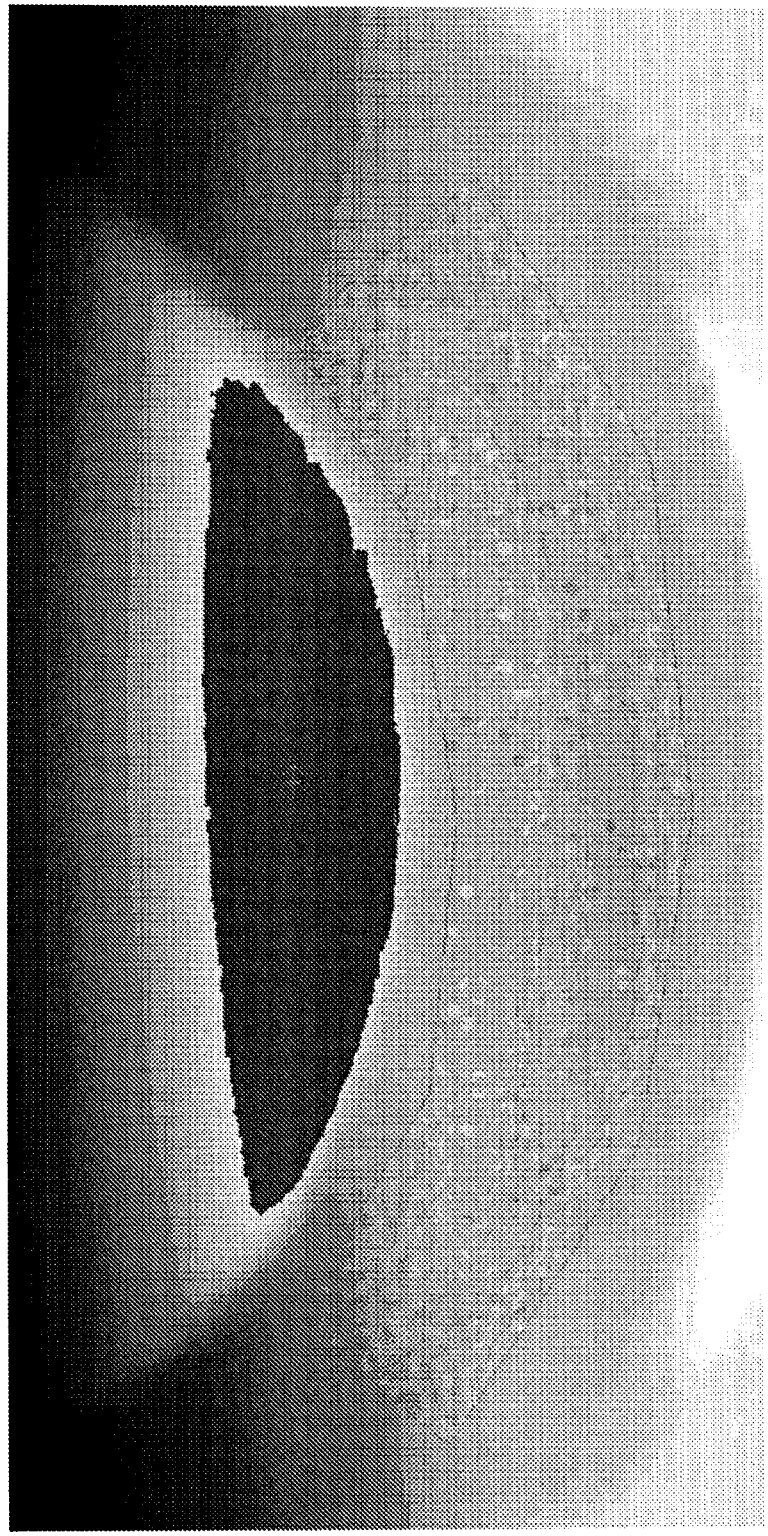
Figure 8C:
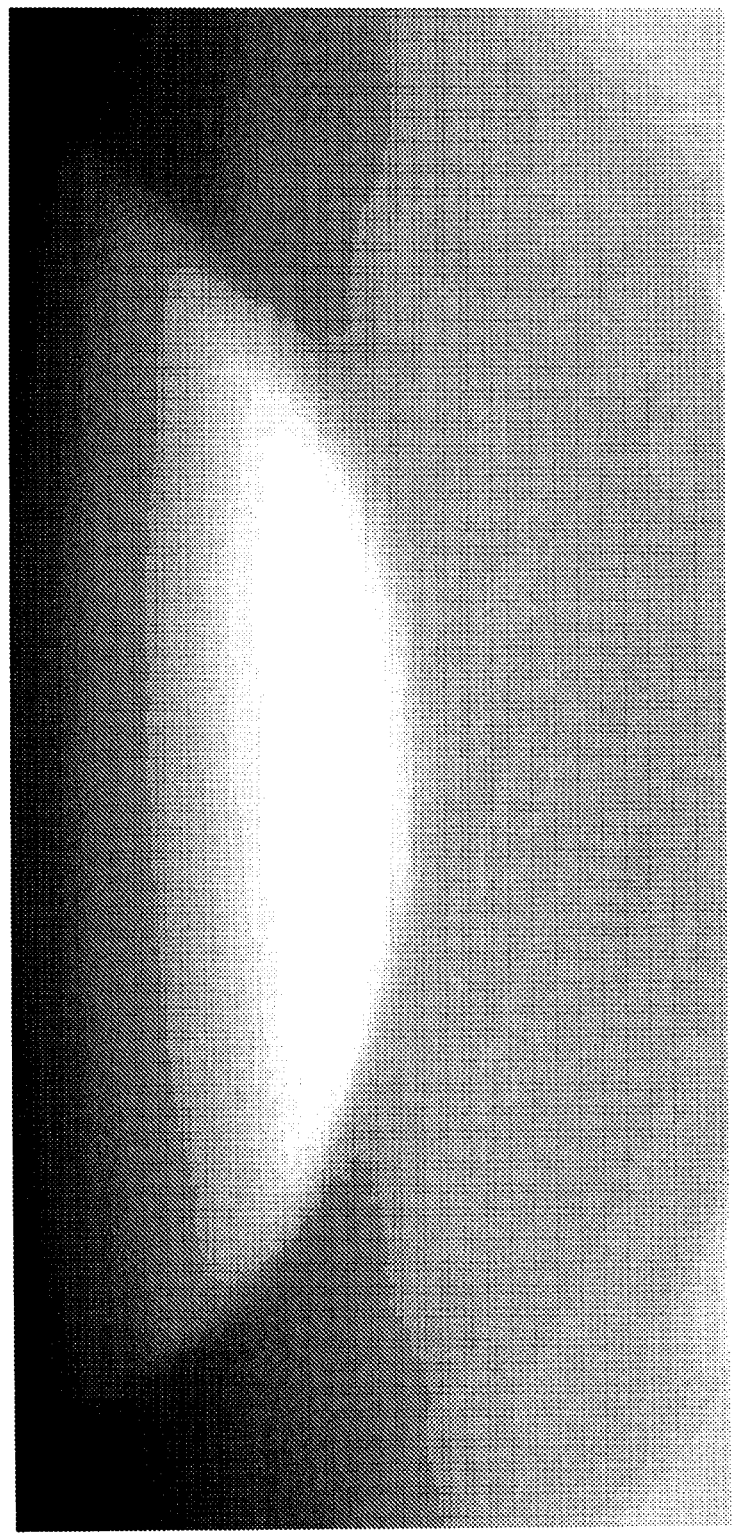

Further images are provided in FIG. 8. FIG. 8(a) shows a processed image before the end point; FIG. 8(b) shows a processed image after the end point in which a series of aligned features, approximately 30° from the horizonal, can be readily detected and FIG. 8(c) shows the corresponding raw image from which the processed image of FIG. 8(b) has been prepared.

It will be understood that the Applicants' approach overcomes the loss of a reference surface and the lack of significant changes in plasma chemistry and, in the use of edge detectors, enables a particularly economic end point detection process and apparatus to be achieved.

What is claimed is:

1. A method of etching the whole width of a substrate to expose buried features, comprising:
    (a) etching a face of a substrate across its width to achieve substantially uniform removal of material;
    (b) illuminating the etched face during the etch process;
    (c) applying edge detection techniques to light reflected or scattered from the face to detect the appearances of buried features;
    (d) modifying the etch in response to the detection of the buried feature.

2. The method as claimed in claim 1, wherein the etched face is illustrated at an acute angle.

3. The method as claimed in claim 1, wherein step (c) includes using a camera to capture the reflected or scattered light for producing an output signal and an edge detector filter for detecting the appearances of edges from the camera output signal.

4. The method as claimed in claim 3, wherein the camera is positioned for receiving light reflected or scattered at an acute angle.

5. The method as claimed in claim 3, wherein the edge detector filter is a Sobel filter.

6. The method as claimed in claim 4, wherein the edge detector filter is a Sobel filter.

7. The method as claimed in claim 1, wherein the step of modifying the etch is the step of stopping the etch.

8. The method as claimed in claim 2, wherein the step of modifying the etch is the step of stopping the etch.

9. The method as claimed in claim 3, wherein the step of modifying the etch is the step of stopping the etch.

10. The method as claimed in claim 2, wherein step (c) includes using a camera to capture the reflected or scattered light for producing an output signal and an edge detector filter for detecting the appearances of edges from the camera output signal.

11. The method as claimed in claim 10, wherein the camera is positioned for receiving light reflected or scattered at an acute angle.

12. The method as claimed in claim 10, wherein the edge detector filter is a Sobel filter.

13. The method as claimed in claim 11, wherein the edge detector filter is a Sobel filter.

14. The method as claimed claim 10 wherein the step of modifying the etch is the step of stopping the etch.

15. A method of etching the whole width of a substrate to expose the ends of buried features, comprising:
(a) etching a face of a substrate across its width to achieve substantially uniform removal of material;
(b) illuminating the etched face during the etch process;
(c) detecting non-homogeneity in an image of the face represented by light reflected or scattered from the face to detect the exposure of the buried features;
(d) modifying the etch in response to the detection of the buried features.

* * * * *

UNITED STATES PATENT AND TRADEMARK OFFICE
CERTIFICATE OF CORRECTION

| | | |
|---|---|---|
| PATENT NO. | : 8,709,268 B2 | Page 1 of 1 |
| APPLICATION NO. | : 13/674482 | |
| DATED | : April 29, 2014 | |
| INVENTOR(S) | : Ansell | |

It is certified that error appears in the above-identified patent and that said Letters Patent is hereby corrected as shown below:

In the claims

Claim 2, line 2, change "illustrated" to -- illuminated --.

Signed and Sealed this
Twenty-sixth Day of April, 2016

Michelle K. Lee
*Director of the United States Patent and Trademark Office*